(12) United States Patent
Miyake et al.

(10) Patent No.: US 10,194,104 B2
(45) Date of Patent: Jan. 29, 2019

(54) IMAGING DEVICE AND IMAGING MODULE

(71) Applicant: Panasonic Intellectual Property Management Co., Ltd., Osaka (JP)

(72) Inventors: Yasuo Miyake, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/885,914

(22) Filed: Feb. 1, 2018

(65) Prior Publication Data
US 2018/0241954 A1 Aug. 23, 2018

(30) Foreign Application Priority Data
Feb. 22, 2017 (JP) ................... 2017-031435

(51) Int. Cl.
*H01L 27/30* (2006.01)
*H04N 5/355* (2011.01)
*H04N 5/359* (2011.01)
*H04N 5/378* (2011.01)

(52) U.S. Cl.
CPC ........... *H04N 5/359* (2013.01); *H01L 27/307* (2013.01); *H04N 5/355* (2013.01); *H04N 5/378* (2013.01)

(58) Field of Classification Search
CPC ........ H04N 5/359; H04N 5/355; H04N 5/378; H04N 5/35563; H04N 5/217; H04N 5/335; H04N 9/045; H04N 9/09; H04N 1/19; H01L 27/307; H01L 27/14621; H01L 27/14623;
(Continued)

(56) References Cited

U.S. PATENT DOCUMENTS 6,831,692 B1 12/2004 Oda
8,101,899 B2 * 1/2012 Yamashita ........... H04N 5/3765
250/208.1
(Continued)

FOREIGN PATENT DOCUMENTS

JP 2000-125209 4/2000
JP 2010-136063 6/2010
(Continued)

*Primary Examiner* — Pritham D Prabhakher
(74) *Attorney, Agent, or Firm* — McDermott Will & Emery LLP

(57) ABSTRACT

An imaging device includes a pixel cell including a photoelectric conversion layer having first and second surfaces, a pixel electrode on the first surface, an auxiliary electrode on the first surface, the auxiliary electrode surrounding the pixel electrode and being electrically insulated from the pixel electrode, a counter electrode on the second surface, and a charge detection circuit connected to the pixel electrode; a voltage supply circuit; a first switch switching between electrical connection and disconnection; a first capacitor having one end connected to the auxiliary electrode and the other end held to a predetermined voltage; and a first control circuit connected to the first switch, the first control circuit causing the first switch to switch between electrical connection and disconnection. The voltage supply circuit is connected, through the first switch, to the auxiliary electrode of the first pixel cell and to the one end of the first capacitor.

8 Claims, 11 Drawing Sheets

(58) Field of Classification Search
CPC ..... H01L 27/148; H01L 27/00; G01T 1/2928; G01T 1/17; G01T 1/16; G01T 1/247
See application file for complete search history.

(56) References Cited

U.S. PATENT DOCUMENTS

| | | | | |
|---|---|---|---|---|
| 8,384,006 | B2* | 2/2013 | Yamashita | H04N 5/3765 250/208.1 |
| 9,502,450 | B2* | 11/2016 | Yanagita | H01L 27/14643 |
| 9,602,743 | B2* | 3/2017 | Yamada | H01L 27/14667 |
| 9,735,204 | B2* | 8/2017 | Sakaida | H01L 27/14612 |
| 9,888,190 | B2* | 2/2018 | Yamada | H01L 27/14603 |
| 10,057,518 | B2* | 8/2018 | Yamada | H01L 27/14667 |
| 2010/0090092 | A1* | 4/2010 | Yamashita | H04N 5/361 250/208.1 |
| 2010/0140490 | A1 | 6/2010 | Tsubota et al. | |
| 2011/0102392 | A1* | 5/2011 | Fujioka | G02F 1/13338 345/207 |
| 2012/0085889 | A1* | 4/2012 | Yamashita | H04N 5/361 250/208.1 |
| 2013/0050548 | A1* | 2/2013 | Yamashita | H01L 27/14621 348/294 |
| 2013/0300962 | A1* | 11/2013 | Kitani | G02F 1/13306 349/37 |
| 2015/0076500 | A1* | 3/2015 | Sakaida | H01L 27/14612 257/59 |
| 2015/0109019 | A1* | 4/2015 | Matsuda | H01L 29/4908 324/762.01 |
| 2015/0280155 | A1* | 10/2015 | Tamaki | H01L 51/441 257/40 |
| 2016/0119563 | A1* | 4/2016 | Yamada | H01L 27/14667 348/230.1 |
| 2017/0125474 | A1* | 5/2017 | Roy | H01L 27/1461 |
| 2017/0150073 | A1* | 5/2017 | Yamada | H01L 27/14667 |
| 2017/0163917 | A1* | 6/2017 | Yamada | H01L 27/14603 |
| 2017/0236844 | A1* | 8/2017 | Yamazaki | H01L 27/1225 257/43 |

FOREIGN PATENT DOCUMENTS

| | | |
|---|---|---|
| JP | 2015-133483 | 7/2015 |
| JP | 2016-086407 | 5/2016 |

* cited by examiner

IMAGING DEVICE AND IMAGING MODULE

BACKGROUND

1. Technical Field

The present disclosure relates to an imaging device and an imaging module.

2. Description of the Related Art

A technology proposed in recent years is to expand a dynamic range in charge-coupled device (CCD) image sensors, complementary metal-oxide-semiconductor (CMOS) image sensors, and other imaging devices. Japanese Patent No. 4018820, for example, discloses an imaging device in which a dynamic range can be expanded by placing high-sensitivity pixel cells and low-sensitivity pixel cells in an imaging area. In the imaging device disclosed in Japanese Patent No. 4018820, a photodiode having a large area is placed in a high-sensitivity pixel cell and a photodiode having a small area is placed in a low-sensitivity pixel cell.

SUMMARY

One non-limiting and exemplary embodiment in this application provides an imaging device that suppresses saturation in pixel cells under high illuminance to enable wide dynamic range photography.

In one general aspect, the techniques disclosed here feature an imaging device that includes at least one pixel cell that includes a first pixel cell, each of the at least one pixel cell including a photoelectric conversion layer having a first surface and a second surface opposite to the first surface, a pixel electrode on the first surface, an auxiliary electrode on the first surface, the auxiliary electrode surrounding the pixel electrode and being electrically insulated from the pixel electrode, a counter electrode on the second surface, the counter electrode facing both of the pixel electrode and the auxiliary electrode, and a charge detection circuit connected to the pixel electrode; a voltage supply circuit that supplies a voltage; a first switch that switches between electrical connection and electrical disconnection; a first capacitor that has one end connected to the auxiliary electrode of the first pixel cell and the other end held to a predetermined voltage; and a first control circuit connected to the first switch, the first control circuit causing the first switch to switch between electrical connection and electrical disconnection. The voltage supply circuit is connected, through the first switch, to the auxiliary electrode of the first pixel cell and to the one end of the first capacitor.

It should be noted that general or specific embodiments may be implemented as an element, a device, a module, a system, an integrated circuit, a method, or any selective combination thereof.

Additional benefits and advantages of the disclosed embodiments will become apparent from the specification and drawings. The benefits and/or advantages may be individually provided by the various embodiments or features disclosed in the specification and drawings, which need not all be provided in order to obtain one or more of such benefits and/or advantages.

DETAILED DESCRIPTION

Figure 1:
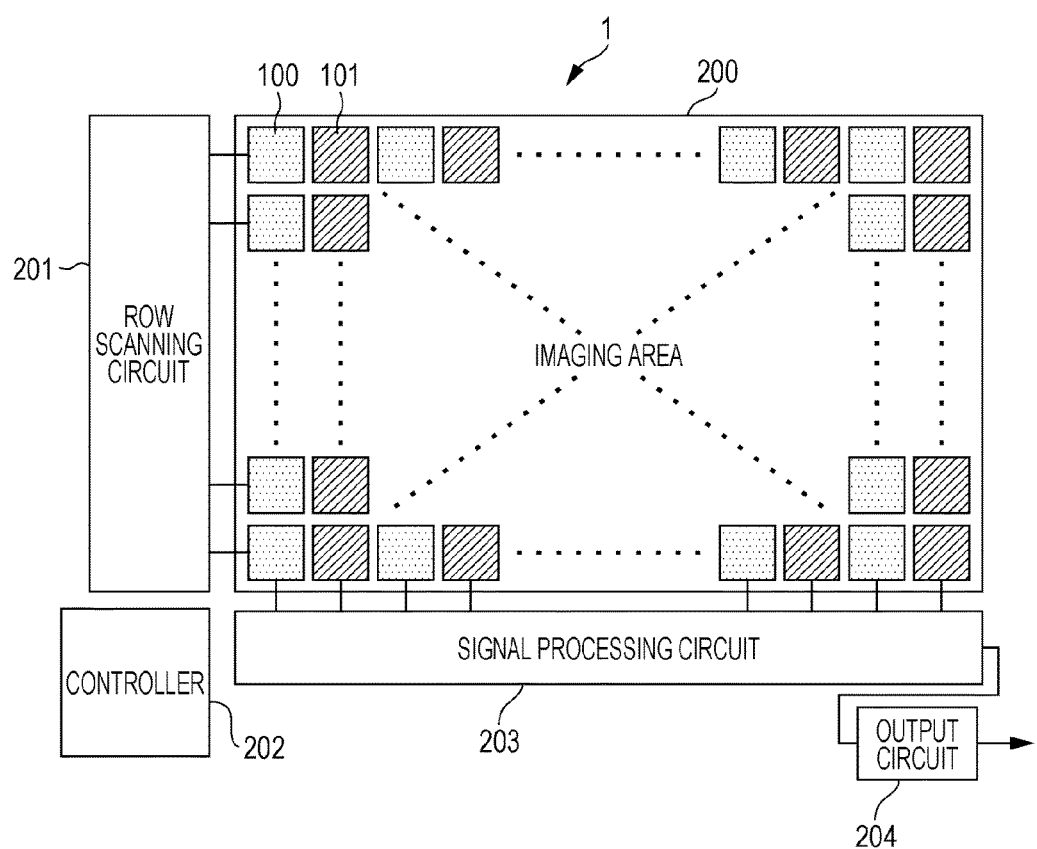
FIG. 1 schematically illustrates the structure of an imaging device according to a first embodiment.

In the imaging device described in Japanese Patent No. 4018820, it is difficult to dynamically lower the sensitivity of the pixel cell. Therefore, if illuminance is very high, charges generated in the pixel cell are saturated, lowering the dynamic range. One non-limiting and exemplary embodiment in this application provides an imaging device that enables wide dynamic range photography.

The present disclosure includes an imaging device and an imaging module described in items below.

Item 1

An imaging device that includes:

at least one pixel cell that includes a first pixel cell, each of the at least one pixel cell including a photoelectric conversion layer having a first surface and a second surface opposite to the first surface, a pixel electrode on the first surface, an auxiliary electrode on the first surface, the auxiliary electrode surrounding the pixel electrode and being electrically insulated from the pixel electrode, a counter electrode on the second surface, the counter electrode facing both of the pixel electrode and the auxiliary electrode, and a charge detection circuit connected to the pixel electrode;

a voltage supply circuit that supplies a voltage;

a first switch that switches between electrical connection and electrical disconnection;

a first capacitor that has one end connected to the auxiliary electrode of the first pixel cell and the other end held to a predetermined voltage; and a first control circuit connected to the first switch, the first control circuit causing the first switch to switch between electrical connection and electrical disconnection, wherein the voltage supply circuit is connected, through the first switch, to the auxiliary electrode of the first pixel cell and to the one end of the first capacitor.

Item 2

In the imaging device according to item 1, the at least one pixel cell includes a second pixel cell, and the auxiliary electrode of the second pixel cell is connected to the auxiliary electrode of the first pixel cell and to the one end of the first capacitor, and the voltage supply circuit is connected, through the first switch, to the auxiliary electrode of the second pixel cell.

Item 3

The imaging device according to item 1 further including:

a second capacitor;

a second switch that switches between electrical connection and electrical disconnection; and a second control circuit connected to the second switch, the second control circuit causing the second switch to switch between electrical connection and electrical disconnection, wherein the at least one pixel cell includes a second pixel cell, the second capacitor has one end connected to the auxiliary electrode of the second pixel cell and the other end held to a predetermined voltage, the voltage supply circuit applies a first voltage to the auxiliary electrode of the first pixel cell through the first switch, and the voltage supply circuit applies a second voltage different from the first voltage, to the auxiliary electrode of the second pixel cell through the second switch.

Item 4

In the imaging device according to item 1 or 2, the voltage supply circuit includes the first switch.

Item 5

In the imaging device according to item 3, the voltage supply circuit includes the first switch and the second switch.

Item 6

In the imaging device according to any one of items 1 to 5, the first control circuit includes a first scanning circuit and a second scanning circuit, the first scanning circuit and the second scanning circuit being connected to the first switch, and the first switch switches between electrical connection and electrical disconnection based on both of a signal from the first scanning circuit and a signal from the second scanning circuit.

Item 7

In the imaging device according to any one of items 1 to 5, the first control circuit includes a first scanning circuit connected to the first switch, and the first switch switches between electrical connection and electrical disconnection based on a signal from the first scanning circuit.

Item 8

An imaging module that includes the imaging device according to any one of items 1 to 7, and a camera signal processor that generates image data by processing an image signal output from the imaging device.

The present disclosure further includes an imaging device and an imaging module described in items below.

Item 1

An imaging device including a plurality of pixel cells and capacitances, each of which is provided in correspondence to one of at least two of the plurality of pixel cells; each of the plurality of pixel cells has a pixel electrode, an auxiliary electrode disposed around the pixel electrode in a plan view of the pixel electrode so as to be electrically insulated from the pixel electrode, a counter electrode opposite to the pixel electrode and auxiliary electrode, and a photoelectric conversion film sandwiched between the counter electrode and the pixel electrode and between the counter electrode and the auxiliary electrode, photoelectric conversion film converting light to charges; each capacitance is connected to the auxiliary electrode in the corresponding pixel cell.

Thus, since a capacitance is connected to the auxiliary electrode in each of at least two pixel cells, a voltage can be individually applied to each capacitance and can be held in it. This enables the sensitivity of each of a plurality of pixel cells to be dynamically adjusted individually. Therefore, the sensitivity of a pixel cell having extremely high illuminance, for example, can be dynamically kept low. Accordingly, saturation of charges generated in the pixel cell can be suppressed, and this enables wide dynamic range photography.

Since the voltage applied to each capacitance is held, the sensitivity of each pixel cell to which a capacitance is connected can be maintained. Therefore, global shuttering becomes possible, in which exposures start at the same time, for a plurality of pixels having different sensitivities.

Item 2

In the imaging device according to item 1, the plurality of pixel cells are placed in an imaging area that includes a first area in which a plurality of first pixel cells are placed and a second area in which a plurality of second pixels are placed; the plurality of capacitances includes a first capacitance connected to the auxiliary electrodes in two first pixel cells and a second capacitance connected to the auxiliary electrodes in two second pixel cells.

Thus, since a capacitance common to a plurality of pixel cells in each of two areas in the imaging area is provided, sensitivities can be individually adjusted for the plurality of pixel cells in each of the two areas. In photography in which different sensitivities are set for pixel cells in an even-numbered column and pixel cells in an odd-numbered column, for example, two types of images having different sensitivities, that is, an image corresponding to the pixel cells in the even-numbered column and an image corresponding to the pixel cells in the odd-numbered column, are obtained in one photography.

Item 3

The imaging device according to item 1, further including a voltage supply circuit that applies voltages to a plurality of capacitances.

Thus, since the imaging device has a voltage supply circuit, an individual voltage can be applied to each capacitance without having to externally provide a voltage supply circuit.

Item 4

The imaging device according to item 1, further including switches, each of which is provided for each capacitance and is connected to the corresponding capacitance, wherein the voltage supply circuit individually applies a voltage to each capacitance through the corresponding switch.

Thus, individual voltages can be applied to the capacitances by a single voltage supply circuit, and this enables a voltage supply circuit to be simplified.

Item 5

In the imaging device according to item 4, the plurality of pixel cells are placed in a matrix, a capacitance is provided for each pixel cell, and the imaging device further has a scanning circuit that drives switches on a per-row or per-column basis.

Thus, since voltages can be applied to capacitances on a per-row or per-column basis, application of voltages to all of the pixel cells is completed at high speed.

Item 6

In the imaging device according to item 5, the voltage supply circuit has voltage appliers, each of which is provided for one column and applies a voltage to the capacitances provided for the pixel cells placed in the column through switches provided for the pixel cells; the scanning circuit drives switches on a per-row basis.

Thus, since an individual voltage can be applied to the capacitance provided for each pixel cell in the active matrix method. Therefore, application of voltages to all of the pixel cells is completed at high speed and with various sensitivity settings.

Item 7

An imaging module that includes the imaging device according to any one of items 1 to 6 and a camera signal processor that processes an image signal output from the imaging device and creates image data.

Thus, an imaging module having an imaging device that enables wide dynamic range photography is implemented.

Embodiments will be specifically described with reference to the drawings. All embodiments described below illustrate general or specific examples. Numerals, shapes, materials, constituent elements, the placement positions and connection forms of these constituent elements, processing timings, and the like are only examples, and are not intended to restrict the present disclosure. Of the constituent elements described in the embodiments below, constituent elements not described in independent claims, each of which indicates the topmost concept, will be described as optional constituent elements.

First Embodiment

The structure and functions of an imaging device according to a first embodiment will be described with reference to FIGS. 1 to 4.

Structure of the Imaging Device

FIG. 1 schematically illustrates the structure of the imaging device 1 according to the first embodiment. Typically, the imaging device 1 has an imaging area 200 in which a plurality of pixel cells are placed in a matrix, a row scanning circuit 201, a controller 202, a signal processing circuit 203, and an output circuit 204. The imaging area 200 has first areas in which a plurality of pixel cells 100 are placed and second areas in which a plurality of pixel cells 101 are placed. In the description below, the plurality of pixel cells 100 in the first areas and the plurality of pixel cells 101 in the second areas will sometimes be referred to as the plurality of pixel cells. Here, the plurality of pixel cells 100 in the first areas and the plurality of pixel cells 101 in the second area constitute all pixel cells in the imaging area 200. The imaging device 1 is typically an image sensor implemented by a single semiconductor chip.

In this embodiment, the imaging device 1 further includes capacitances, each of which is provided in correspondence to one of at least two of the plurality of pixel cells, and a voltage supply circuit that applies a voltage to each capacitance. The capacitance indicates a capacitor. However, a parasitic capacitance may be used. These capacitances and voltage supply circuit will be described later with reference to FIG. 3.

As illustrated in FIG. 1, the plurality of pixel cells 100 are placed in even-numbered columns and the plurality of pixel cells 101 are placed in odd-numbered columns, for example. That is, in FIG. 1, a first area is an even-numbered column and a second area is an odd-numbered column. The plurality of cells may be placed in one dimension. In this case, the imaging device 1 may be a line sensor.

The row scanning circuit 201 is connected to the plurality of pixel cells 100 and the plurality of pixel cells 101 through various control lines. The row scanning circuit 201 selects a plurality of pixel cells placed in one row at a time, reads out a signal voltage, and resets the potentials of the pixel electrodes. The row scanning circuit 201 is also referred to as the vertical scanning circuit. The controller 202 controls the whole of the imaging device 1.

The signal processing circuit 203 performs signal processing on the signal voltage read out from each pixel cell. Specifically, the signal processing circuit 203 performs noise reduction signal processing typified by correlated double sampling, analog-digital (AD) conversion, and other processing.

The output circuit 204 outputs a signal voltage resulting from the processing by the signal processing circuit 203 to the outside of the imaging device 1.

Device Structure of Each Pixel Cell

Figure 2A:
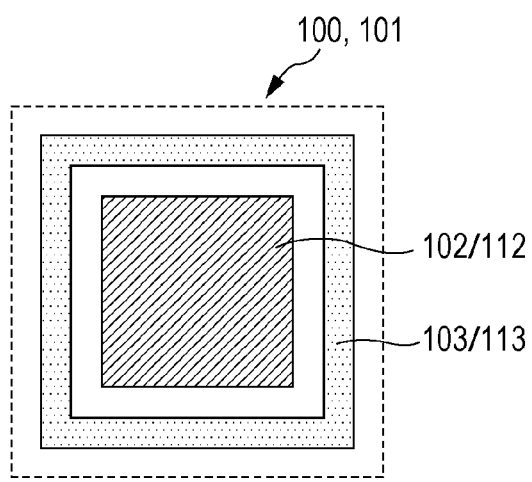
FIG. 2A schematically illustrates an example of the layout of a pixel electrode and an auxiliary electrode in the pixel cell in FIG. 1.
Figure 2B:
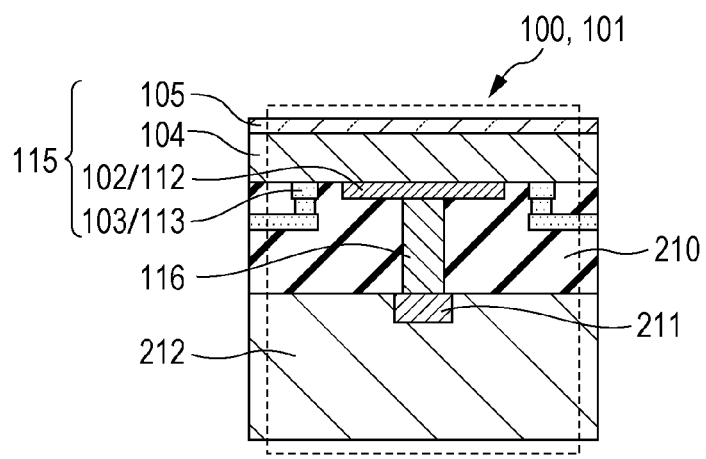
FIG. 2B is a schematic cross-sectional view illustrating the device structures of the pixel cells in FIG. 1.

FIG. 2A schematically illustrates an example of the layout of a pixel electrode 102 and an auxiliary electrode 103 included in the pixel cell 100 and an example of the layout of a pixel electrode 112 and an auxiliary electrode 113 included in the pixel cell 101. FIG. 2B is a schematic cross-sectional view illustrating the device structures of the pixel cell 100 and pixel cell 101. In the layout examples in FIG. 2A and the device structures in FIG. 2B, there is no difference between the pixel cell 100 and pixel cell 101. Therefore, in descriptions given below with reference to FIGS. 2A and 2B, the pixel electrode 102 will be described as a representative of the pixel electrode 102 and pixel electrode 112, and the auxiliary electrode 103 will be described as a representative of the auxiliary electrode 103 and auxiliary electrode 113.

The pixel cell 100 and pixel cell 101 each include a semiconductor substrate 212, a readout circuit 211, and a photoelectric convertor 115. The semiconductor substrate 212 is, for example, a p-type silicon substrate. The readout circuit 211 detects a signal charge captured by the pixel electrode 102 and outputs a signal voltage matching the signal charge. The readout circuit 211 typically includes an amplifying transistor, a reset transistor, an address transistor, and the like. The readout circuit 211 is formed on the semiconductor substrate 212.

An inter-layer insulating layer 210 is laminated on the front surface of the semiconductor substrate 212. In the inter-layer insulating layer 210, a contact plug 116, which electrically interconnects the readout circuit 211 and pixel electrode 102, various wires, and the like are buried.

The photoelectric convertor 115 is disposed on the inter-layer insulating layer 210. The photoelectric convertor 115 includes the pixel electrode 102, the auxiliary electrode 103, a counter electrode 105 disposed opposite to pixel electrode 102 and auxiliary electrode 103, and a photoelectric conversion film 104. The photoelectric conversion film 104 is sandwiched between the counter electrode 105 and the pixel electrode 102 and between the counter electrode 105 and the auxiliary electrode 103. In other words, the pixel electrode 102 and auxiliary electrode 103 are placed on a first surface of the photoelectric conversion film 104, and the counter electrode 105 is placed on a second surface of the photoelectric conversion film 104, the second surface being opposite to the first surface.

The counter electrode 105 is formed from, for example, a conductive transparent material such as an indium tin oxide (ITO) material. The pixel electrode 102 and auxiliary electrode 103 are formed from polysilicon that has conductivity given by doping a metal or an impurity. Examples of metals include aluminum and copper. Although not illustrated, the pixel cells 100 and 101 may have, on the counter electrode 105, a color filter and a microlens that collects light.

As illustrated in FIG. 2A, the pixel electrode 102 has a rectangular shape and the auxiliary electrode 103 has a rectangular ring shape that encloses the pixel electrode 102. Like this, in this embodiment, the auxiliary electrode 103 is continuously formed so as to enclose the pixel electrode 102. The pixel electrode 102 and auxiliary electrode 103 are separated by a predetermined distance with a spacing intervening therebetween. That is, the auxiliary electrode 103 is disposed around the pixel electrode 102 in a plan view so as to be electrically insulated from the pixel electrode 102.

Now, the principle of the modulation of the sensitivity of the pixel cell 100 and pixel cell 101 will be described in detail. In this embodiment, the imaging device 1 detects the positive hole of an electron-hole pair generated by photoelectric conversion in the photoelectric conversion film 104 as a signal charge. However, the imaging device 1 may detect the electron as the signal charge.

The photoelectric conversion film 104 converts light into charges. The sensitivities of the pixel cells 100 and 101 are modulated by an electric field generated by a difference in potential between the pixel electrode 102 and the counter electrode 105 and an electric field generated by a difference in potential between the auxiliary electrode 103 and the counter electrode 105. A case will be considered in which the potentials of the pixel electrode 102 and auxiliary electrode 103 are set so as to be lower than the potential of the counter electrode 105 and in which a difference in potential between the pixel electrode 102 and the counter electrode 105 and a difference in potential between the auxiliary electrode 103 and the counter electrode 105 are generated. In this case, positive holes generated in the photoelectric conversion film 104 by photoelectric conversion move to the pixel electrode 102 and auxiliary electrode 103. If, for example, the difference in potential between the pixel electrode 102 and the counter electrode 105 is larger than the difference in potential between the auxiliary electrode 103 and the counter electrode 105, charges (positive holes, in this example) generated in the photoelectric conversion film 104 in the vicinity of the auxiliary electrode 103 are likely to flow into the pixel electrode 102 and are less likely to flow into the auxiliary electrode 103. As a result, these charges are read out by the readout circuit 211 connected to the pixel electrode 102 and contribute to the sensitivity of the pixel cell 100 in the first area.

By contrast, if the difference in potential between the pixel electrode 102 and the counter electrode 105 is smaller than the difference in potential between the auxiliary electrode 103 and the counter electrode 105, charges generated in the photoelectric conversion film 104 in the vicinity of the auxiliary electrode 103 are likely to flow into the auxiliary electrode 103 and are less likely to flow into the pixel electrode 102. Of the charges generated in the vicinity of the auxiliary electrode 103, charges that have flowed into the auxiliary electrode 103 do not contribute to the sensitivity of the pixel cell 100. In other words, if the difference in potential between the pixel electrode 102 and the counter electrode 105 is smaller than the difference in potential between the auxiliary electrode 103 and the counter electrode 105, the size of the effective sensitivity area of the pixel cell 100 becomes narrower than in a case in which the difference in potential between the pixel electrode 102 and the counter electrode 105 is larger than the difference in potential between the auxiliary electrode 103 and the counter electrode 105. The effective sensitivity area is a substantial light receiving area of the photoelectric conversion film, the substantial light receiving area being one of the factors that determine the sensitivity of a pixel cell.

The photoelectric conversion film 104 is typically formed from an organic material. An example of an organic material has a structure in which a p-type organic semiconductor and an n-type organic semiconductor are joined together. As the p-type organic semiconductor, an electron-releasing organic compound can be used. Examples of electron-releasing organic compounds include triarylamine compounds, benzidine compounds, and pyrazoline compounds. As the n-type organic semiconductor, an electron-accepting compound can be used. Examples of electron-accepting compounds include condensed aromatic carbocyclic compounds, polyarylene compounds, and five- to seven-membered heterocycle compounds including a nitrogen atom, an oxygen atom, or a sulfur atom.

Figure 3:
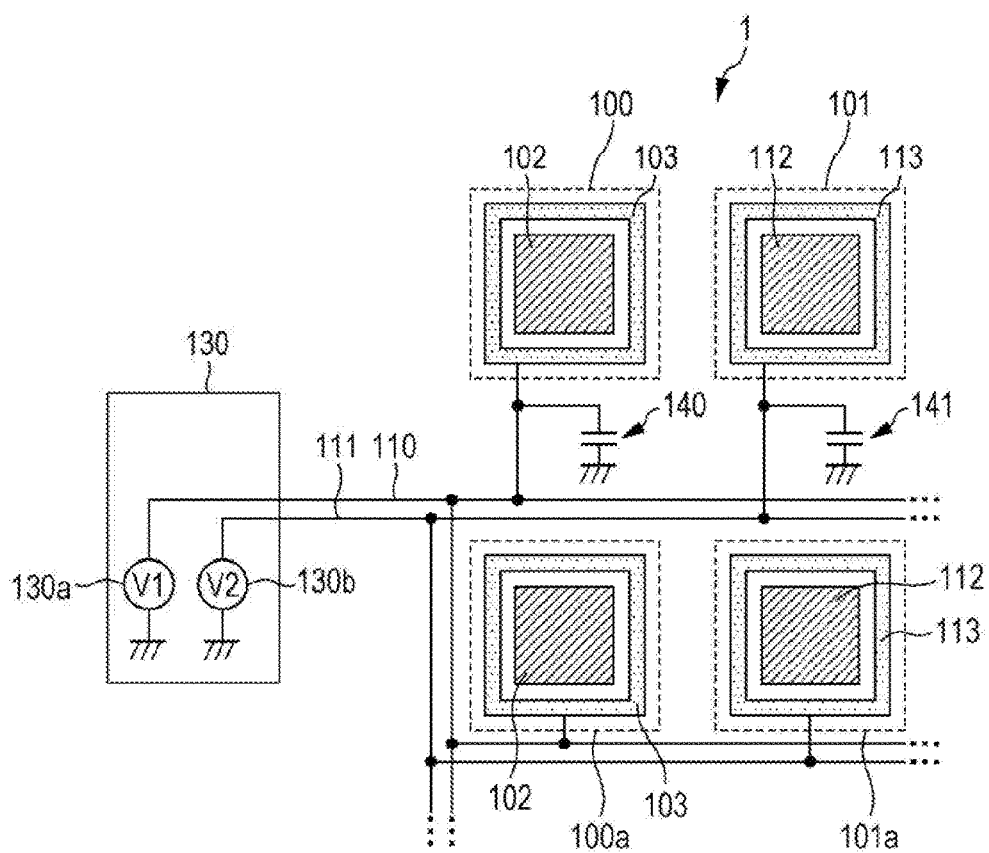
FIG. 3 illustrates a plurality of capacitors and a voltage supply circuit that are included in the imaging device according to the first embodiment.

FIG. 3 illustrates capacitances 140 and 141 and a voltage supply circuit 130 that are included in the imaging device 1 according to this embodiment. This drawing schematically illustrates electrical connections among the voltage supply circuit 130, the auxiliary electrodes 103 in two pixel cells 100 and 100a in the first area, and the auxiliary electrodes 113 in two pixel cells 101 and 101a in the second area.

The voltage supply circuit 130 has two voltage appliers 130a and 130b, each of which independently generates a predetermined voltage. Thus, an individual voltage can be applied to each of a plurality of pixel cells including the two pixel cells 100 and 100a and to each of a plurality of pixel cells including the two pixel cells 101 and 101a. The intensities of voltages applied to the pixel cells 100 and 100a and the pixel cells 101 and 101a are appropriately determined in response to, for example, commands entered by the manipulator manipulating the imaging device 1 or commands from the controller 202 (see FIG. 1) in the imaging device 1.

The voltage applier 130a is connected to the auxiliary electrodes 103 in the pixel cells 100 and 100a through a wire 110. The capacitance 140 is connected between the wire 110 and ground. In this embodiment, the capacitance 140 is provided in correspondence to the pixel cell 100. However, the capacitance 140 is common to the pixel cells 100 and 100a.

Similarly, the voltage applier 130b is connected to the auxiliary electrodes 113 in the pixel cells 101 and 101a through a wire 111. The capacitance 141 is connected between the wire 111 and ground. In this embodiment, the capacitance 141 is provided in correspondence to the pixel cell 101. However, the capacitance 141 is common to the pixel cells 101 and 101a.

In the structure described above, the voltage supply circuit 130 can apply individual voltages to the auxiliary electrodes 103 in the pixel cells 100 and 100a and to the auxiliary electrodes 113 in the pixel cells 101 and 101a.

In this embodiment, the voltage applier 130a applies a voltage V1 to the auxiliary electrode 103 through the wire 110, and the voltage applier 130b applies a voltage V2 to the auxiliary electrode 113 through the wire 111. A voltage V3 is applied to the counter electrode 105 from an counter voltage supply circuit (not illustrated). As an example, the voltage V1 is higher than the voltage V2. The voltage V3 is higher than the voltage V1. A voltage V4 at the pixel electrodes 102 and 112 is lower than the voltage V2. In this case, the difference in potential between the auxiliary electrode 103 and the counter electrode 105 is lower than the difference in potential between the auxiliary electrode 113 and the counter electrode 105. As a result, in the pixel cells 100 and 100a, positive holes generated in the vicinity of the auxiliary electrode 103 are more likely to flow into the pixel electrode 102 than in the pixel cells 101 and 101a. That is, the effective sensitivity areas of the pixel cells 100 and 100a become larger than the effective sensitivity areas of the pixel cells 101 and 101a. Therefore, the sensitivities of the pixel cells 100 and 100a can be made higher than the sensitivities of the pixel cells 101 and 101a. That is, it becomes possible to control the size of the effective sensitivity area according to the applied voltage. In an application of this, the voltages V1 and V2 may be dynamically changed according to, for example, illuminance during photography.

In this embodiment, the capacitance 140 is provided for the wire 110 and the capacitance 141 is provided for the wire 111. Thus, after the voltage supply circuit 130 has output voltages, even if the output state of the voltage supply circuit 130 is placed in a floating state, the output voltages are held in the capacitances 140 and 141. A switch may be provided at an intermediate point of each of the wires 110 and 111 in the vicinity of the output side of the voltage supply circuit 130. After the voltage supply circuit 130 has output voltages, these switches may be turned off. Even in this case, the output voltages are held in the capacitances 140 and 141. That is, the capacitances 140 and 141 sample and hold the voltages output from the voltage supply circuit 130. The voltage held in the capacitance 140 and the voltage held in the capacitance 141 respectively continue to be applied to the auxiliary electrodes 103 and 113.

Figure 4:
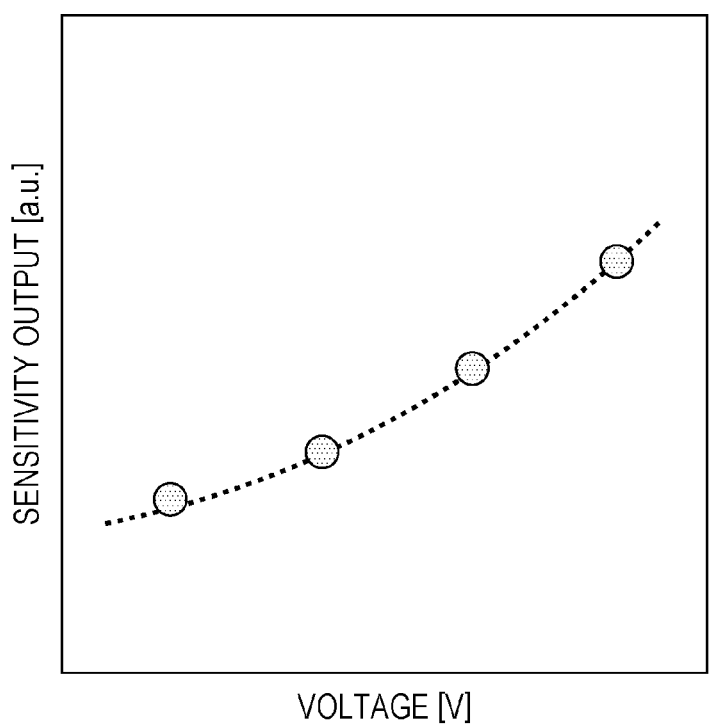
FIG. 4 schematically illustrates a relationship between sensitivity output and voltage applied to the auxiliary electrode in the pixel cell.

FIG. 4 schematically illustrates a relationship between sensitivity output and voltage applied to the auxiliary electrode. Sensitivity output is equivalent to the size of the effective sensitivity area of the pixel cell. When the voltage to be applied to the auxiliary electrode is changed, sensitivity output changes. If a detected charge is a positive hole, when the voltage to be applied to the auxiliary electrode is increased, the sensitivity output of the pixel cell is increased. If, for example, a relatively high voltage is applied to the auxiliary electrode 103, the sensitivity of the pixel cell 100 is raised. By contrast, if, for example, a relatively low voltage is applied to the auxiliary electrode 113, the sensitivity of the pixel cell 101 is lowered.

In this embodiment, the capacitances 140 and 141 are respectively connected to the auxiliary electrodes 103 and 113. Therefore, even if the voltage to be applied to the auxiliary electrode is varied due to disturbance noise or the like, the potential of the auxiliary electrode is less likely to vary. This makes it possible to perform imaging in a state in which sensitivity is more stable.

As described above, the imaging device 1 according to this embodiment has the capacitances 140 and 141 that are provided in correspondence to at least two pixel cells 100 and 101 of a plurality of pixel cells, the capacitance 140 corresponding to the pixel cell 100, the capacitance 141 corresponding to the pixel cell 101. Each of the plurality of pixel cells has the pixel electrode 102 or pixel electrode 112, the auxiliary electrode 103 or 113, which is respectively insulated electrically from the pixel electrode 102 or 112 and is respectively disposed around the pixel electrode 102 or 112 in a plan view, the counter electrode 105, which faces the pixel electrode 102 or pixel electrode 112 and also faces the auxiliary electrode 103 or auxiliary electrode 113, and the photoelectric conversion film 104 sandwiched between the counter electrode 105 and the pixel electrode 102 or pixel electrode 112 and between the counter electrode 105 and the auxiliary electrode 103 or 113, photoelectric conversion film 104 converting light into charges. The capacitances 140 and 141 are respectively connected to the auxiliary electrodes 103 and 113 in their respective pixel cells.

The capacitance 140 is connected to the auxiliary electrode 103 in the pixel cell 100, and the capacitance 141 is connected to the auxiliary electrode 113 in the pixel cell 101. When voltages are individually applied to the capacitances 140 and 141 and are held in them, the sensitivities of the pixel cells 100 and 101 can be independently adjusted. The sensitivities of the pixel cells 100 and 101 can also be dynamically adjusted. Therefore, when, for example, the sensitivity of a pixel cell having extremely high illuminance is dynamically suppressed, saturation of charges generated in the pixel cell can be suppressed, and this enables wide dynamic range photography.

Since the voltage applied to the capacitance 140 is held in it and the voltage applied to the capacitance 141 is held in it, it is possible to maintain the sensitivity of the pixel cell 100 to which the capacitance 140 is connected and the sensitivity of the pixel cell 101 to which the capacitance 141 is connected. Thus, global shuttering, in which exposures start at the same time, becomes possible in a state in which the pixel cells 100 and 101 have different sensitivities.

The imaging device 1 according to this embodiment also includes the pixel cells 100 and 100a disposed in the first area and the pixel cells 101 and 101a disposed in the second area. The imaging device 1 according to this embodiment also includes the capacitance 140 connected in common to the auxiliary electrodes 103 in the pixel cells 100 and 100a and the capacitance 141 connected in common to the auxiliary electrodes 113 in the pixel cells 101 and 101a.

As described above, since a capacitance common to a plurality of pixel cells in each of two areas in the imaging area is provided, sensitivity can be individually adjusted for each of the two areas. In photography in which different sensitivities are set for different columns, for example, two images having different sensitivities, that is, an image corresponding to pixel cells in an even-numbered column and an image corresponding to pixel cells in an odd-numbered column, are obtained in one photography.

The imaging device 1 according to this embodiment further has the voltage supply circuit 130 that applies a voltage to each capacitance.

Thus, since the imaging device 1 has the voltage supply circuit 130, a individual voltage can be individually applied to each capacitance without having to externally provide a voltage supply circuit.

Second Embodiment

Next, an imaging device according to a second embodiment will be described with reference to FIGS. 5A and 5B.

The imaging device 2 according to the second embodiment differs from the imaging device 1 in the first embodiment in that the imaging device 2 has a switch 135a that makes or breaks a connection between the voltage supply circuit 131 and the auxiliary electrode 103 in the pixel cell 100 and between the voltage supply circuit 131 and the auxiliary electrode 103 in the pixel cell 100a and also has a switch 135b that makes or breaks a connection between the voltage supply circuit 131 and the auxiliary electrode 113 in the pixel cell 101 and between a voltage supply circuit 131 and the auxiliary electrode 113 in the pixel cell 101a. In other respects excluding the voltage supply circuit 131 and switches 135a and 135b, the structure of the imaging device 2 is the same as in the first embodiment. Therefore, the imaging device 2 will be described below, mainly focusing on the operations of the voltage supply circuit 131 and switches 135a and 135b.

Figure 5A:
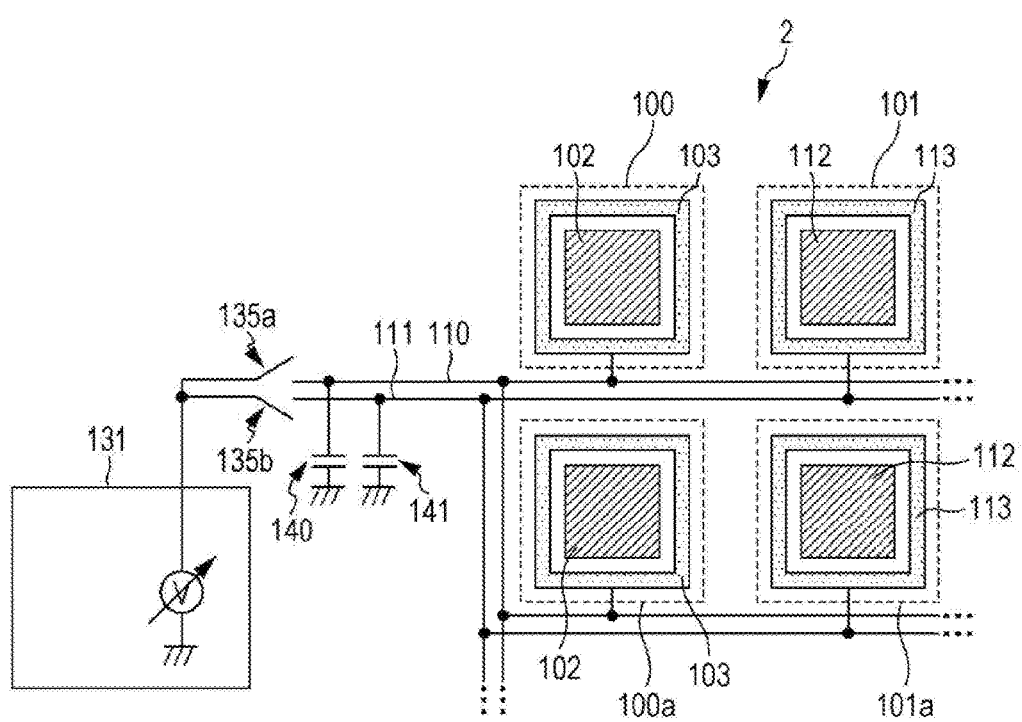
FIG. 5A schematically illustrates electrical connections between a voltage supply circuit and auxiliary electrodes in pixel cells in an imaging device according to a second embodiment.

FIG. 5A schematically illustrates electrical connections between the voltage supply circuit 131 and the auxiliary electrode 103 in the pixel cell 100 and between the voltage supply circuit 131 and the auxiliary electrode 103 in the pixel cell 100a and electrical connections between the voltage supply circuit 131 and the auxiliary electrode 113 in the pixel cell 101 and between the voltage supply circuit 131 and the auxiliary electrode 113 in the pixel cell 101a, in the imaging device 2 according to the second embodiment.

The voltage supply circuit 131 has one voltage applier that generates predetermined voltages. The voltage supply circuit 131 can apply voltages to a plurality of pixel cells including the pixel cells 100 and 100a through the switch 135a and can also apply voltages to a plurality of pixel cells including the pixel cells 101 and 101a through the switch 135b. Predetermined voltages applied to control the switches 135a and 135b, predetermined voltages applied to the pixel cells 100 and 100a, and predetermined voltages applied to the pixel cells 101 and 101a are appropriately determined in response to, for example, commands entered by the manipulator manipulating the imaging device 2 or commands from the controller 202 (see FIG. 1) in the imaging device 2.

When, in this structure, the switches 135a and 135b are selectively turned on, a single voltage supply circuit 131 can be used to apply individual voltages to the auxiliary electrodes 103 and 113. Although, in the first embodiment, the voltage supply circuit 130 has had two independent voltage appliers 130a and 130b, the voltage supply circuit 131 in this embodiment has only one voltage supply circuit. According to this embodiment, therefore, the number of voltage supply circuits can be substantially reduced, so the imaging module including the imaging device 2 and the like can be made compact.

In this embodiment, the voltage supply circuit 131 applies the voltage V1 to the auxiliary electrode 103 through the wire 110 and also applies the voltage V2 to the auxiliary electrode 113 through the wire 111. For example, the voltage V1 is higher than the voltage V2. As a result, the sizes of the effective sensitivity areas of the pixel cells 100 and 100a become larger than the sizes of the effective sensitivity areas of the pixel cells 101 and 101a. Accordingly, the sensitivities of the pixel cells 100 and 100a can be made higher than the sensitivities of the pixel cells 101 and 101a. That is, it becomes possible to control the size of the effective sensitivity area according to the voltage to be applied. In an application of this, the voltages V1 and V2 may be dynamically changed according to, for example, illuminance during photographing.

Figure 5B:
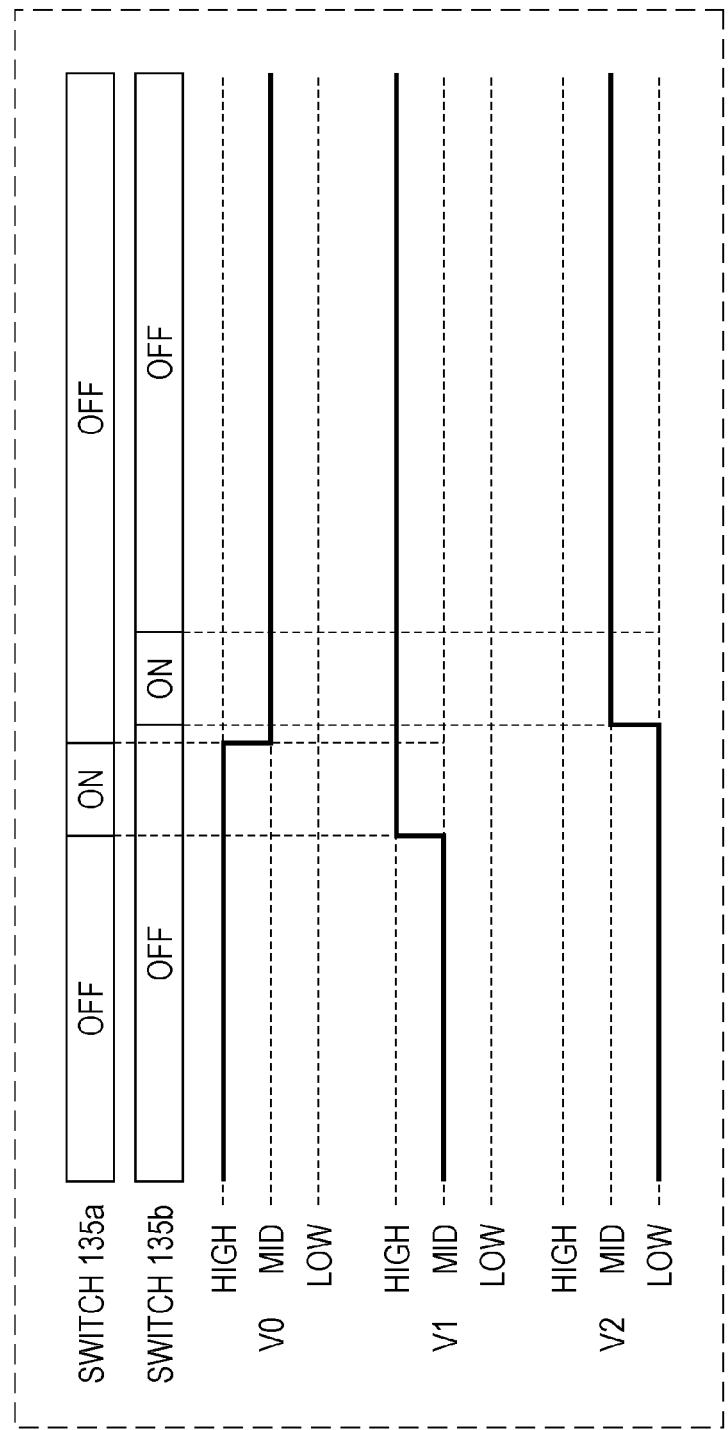
FIG. 5B is a timing diagram illustrating timing when the voltage supply circuit changes voltages in the imaging device in the second embodiment.

FIG. 5B is a timing diagram illustrating timing when the voltage supply circuit 131 changes the voltages V1 and V2 in the imaging device 2 in this embodiment. In FIG. 5B, "switch 135a" indicates the state of the switch 135a, "switch 135b" indicates the state of the switch 135b, VO indicates a voltage output by the voltage supply circuit 131, V1 indicates the voltage V1 to be applied to the auxiliary electrode 103, and V2 indicates the voltage V2 to be applied to the auxiliary electrode 113.

As illustrated in the timing diagram in FIG. 5B, if, for example, illuminance is relatively high, when the voltage V1 is set to an MID level, which is an intermediate level between a low level and a high level and the voltage V2 is set to the low level, it is possible to lower the sensitivity and thereby to suppress saturation in the pixel cell. If illuminance is low to the extent that saturation does not occur in the pixel, when the voltage V1 is set to the high level and voltage V2 is set to the intermediate MID level, the sensitivity of the pixel cell can be raised.

In this embodiment, since the size of the effective sensitive area of the pixel cell is controlled according to the illuminance, the sensitivity can be dynamically modulated. When individual sensitivities are optimized according to the photography scene, the dynamic range can be expanded.

As described above, the imaging device 2 according to this embodiment further has the switches 135a and 135b, which are respectively provided in correspondence to the capacitances 140 and 141. The voltage supply circuit 131 individually applies a voltage to the capacitance 140 through the switch 135a and also individually applies a voltage to the capacitance 141 through the switch 135b.

Thus, voltages can be individually applied to the capacitances 140 and 141 by a single voltage supply circuit 131, and this enables a voltage supply circuit to be simplified.

Third Embodiment

Next, an imaging device according to a third embodiment will be described with reference to FIGS. 6A and 6B.

The imaging device 3 according to the third embodiment differs from the imaging device 2 according to the second embodiment in that the imaging device 3 has scanning transistors 134a to 134d, each of which is disposed in correspondence to one pixel cell, a row scanning circuit 160 placed in the row direction, and a column scanning circuit 162 placed in the columnar direction.

Figure 6A:
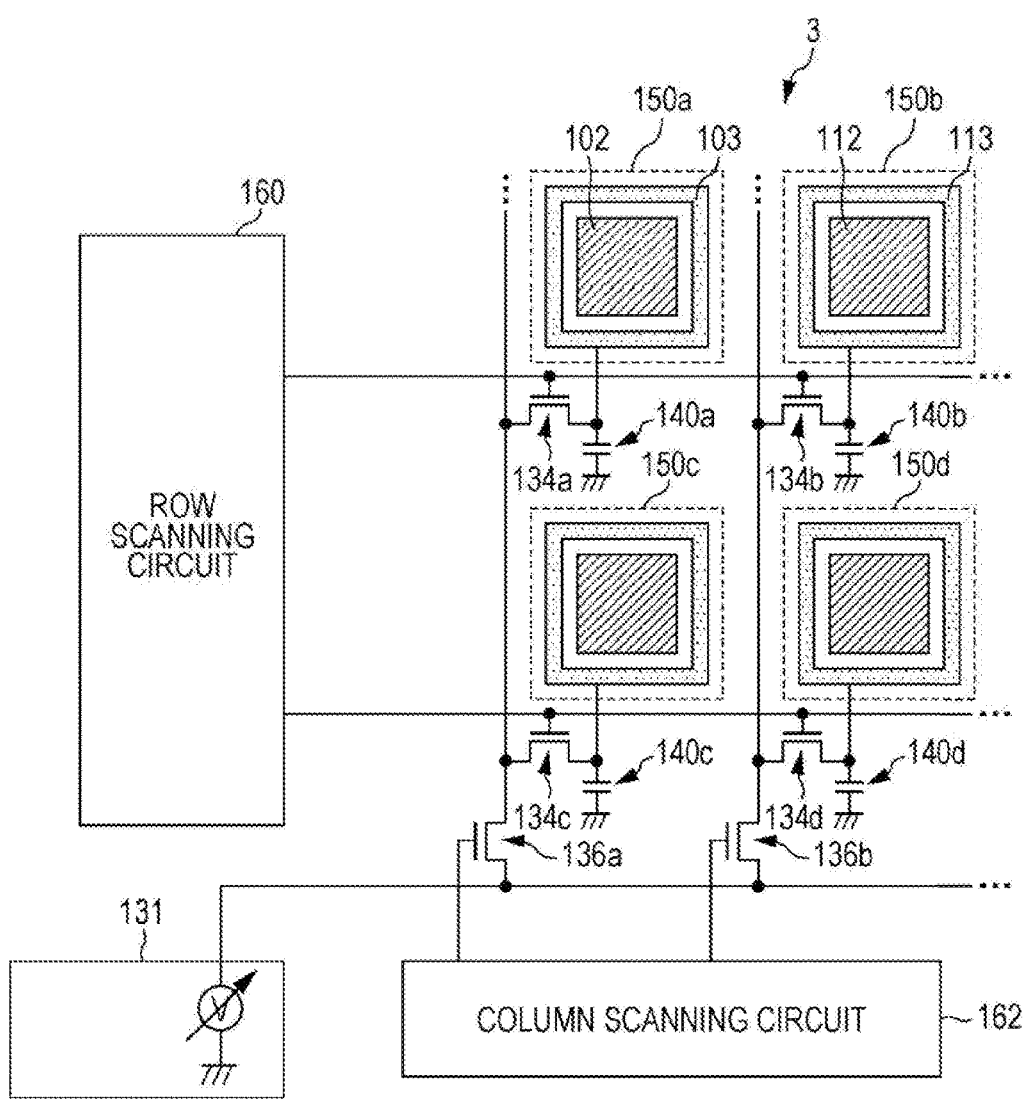
FIG. 6A schematically illustrates electrical connections among auxiliary electrodes, a voltage supply circuit, a row scanning circuit, and a column scanning circuit in an imaging device according to a third embodiment.

FIG. 6A schematically illustrates electrical connections among the auxiliary electrodes 103 and 113, voltage supply circuit 131, row scanning circuit 160, and column scanning circuit 162 in the imaging device 3 according to the third embodiment.

The voltage supply circuit 131 generates predetermined voltages. The voltage supply circuit 131 can apply individual voltages to pixel cells 150a to 150d through the transistors 134a to 134d and transistors 136a and 136b. The transistors 134a to 134d are connected to the row scanning circuit 160. The transistors 136a and 136b are connected to the column scanning circuit 162. Voltages applied to control the transistors 134a to 134d and transistors 136a and 136b and predetermined voltages applied to the pixel cells 100, 100a, 101, and 101a are appropriately determined in response to, for example, commands entered by the manipulator manipulating the imaging device 3 or commands from the controller 202 (see FIG. 1) in the imaging device 3.

In this embodiment, capacitances 140a to 140d are respectively provided in correspondence to the pixel cells 150a to 150d. Specifically, the capacitance 140a is connected between ground and a point at which the output terminal (the drain terminal, for example) of the transistor 134a and the auxiliary electrode 103 in the pixel cell 150a are connected. Similarly, each of the capacitances 140b to 140d is connected between ground and a point at which the output terminal of the relevant transistor 134b, 134c, or 134d and the auxiliary electrode 103 or 113, whichever is appropriate, in the relevant pixel cell 150b, 150c, or 150d.

Figure 6B:
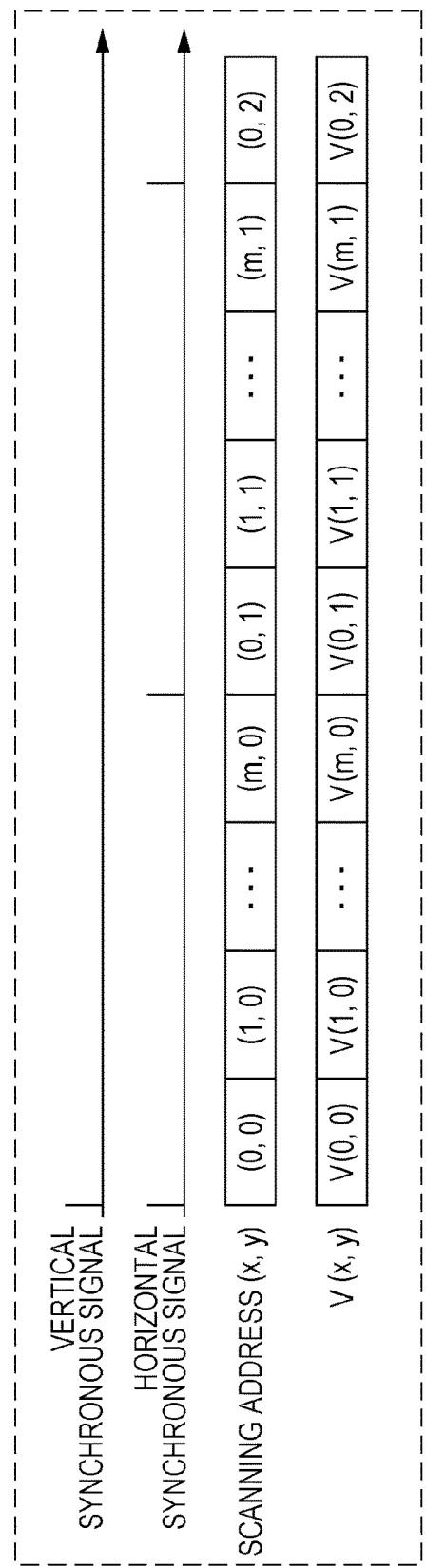
FIG. 6B is a timing diagram illustrating timing when the voltage supply circuit changes voltage for each area in the imaging device according to the third embodiment.

FIG. 6B is a timing diagram illustrating timing when the voltage supply circuit 131 changes voltage for each area in the imaging device 3 according to the third embodiment. In this drawing, "vertical synchronous signal" indicates a timing at which one frame starts, "horizontal synchronous signal" indicates a timing at which one line starts, "scanning address (x, y)" indicates that a column to be selected by the column scanning circuit 162 is the (x+1)th column and a row to be selected by the row scanning circuit 160 is the (y+1)th row, and V(x, y) indicates a voltage output from the voltage supply circuit 131 to the pixel cell positioned in the (x+1)th column and (y+1)th row. In the imaging device 3, pixel cells are placed in a matrix of (m+1) columns and (n+1) rows; x is an integer that is at least 0 and at most m, and y is an integer that is at least 0 and at most n.

At a timing at which a vertical synchronous signal and a horizontal synchronous signal are input, scanning address (0, 0) is selected by the row scanning circuit 160 and column scanning circuit 162 and the voltage supply circuit 131 outputs voltage V(0, 0). Thus, the voltage V(0, 0) is applied to the auxiliary electrode 103 in the area indicated by scanning address (0, 0) and to the capacitance 140a. Since the voltage V(0, 0) is held in the capacitance 140a, even if scanning address (0, 0) is deselected, voltage V(0, 0) applied to the auxiliary electrode 103 and capacitance 140a is maintained.

The value of x in the scanning address is sequentially incremented. During one horizontal synchronous period, addresses in all columns are selected. The voltage supply circuit 131 outputs a voltage corresponding to each address.

At a timing at which a next horizontal synchronous signal is input, the value of the y address is incremented. Similarly, the value of x in the scanning address is sequentially incremented, starting from scanning address (0, 1). The voltage supply circuit 131 outputs a voltage corresponding to each address.

In this embodiment, since the sizes of the effective sensitive areas of a plurality of areas are controlled by a single voltage supply circuit 131, the sensitivity can be dynamically modulated for each area. When the sensitivities of individual areas are optimized according to the photography scene, the dynamic range can be expanded.

As described above, in the imaging device 3 in this embodiment, the capacitances 140a to 140d are respectively provided in correspondence to a plurality of pixel cells 150a to 150d, which are two-dimensionally placed in the row direction and column direction. The imaging device 3 further has the row scanning circuit 160 and column scanning circuit 162. The row scanning circuit 160 drives the transistors 134a to 134d and the transistors 136a and 136b on a per-row basis. The column scanning circuit 162 drives these transistors on a per-column basis.

Thus, voltages can be applied to the capacitances 140a to 140d, which are respectively provided in correspondence to the pixel cells 150a to 150d on a per-row or per-column basis. Therefore, application of voltages to all of the pixel cells 150a to 150d is completed at high speed.

Fourth Embodiment

Next, an imaging device according to a fourth embodiment will be described with reference to FIGS. 7A and 7B.

The imaging device 4 according to the fourth embodiment differs from the imaging device 3 according to the third embodiment in that a voltage supply circuit 132 is connected to each signal line, which is provided for one column, and that the imaging device 4 lacks a column scanning circuit.

Figure 7A:
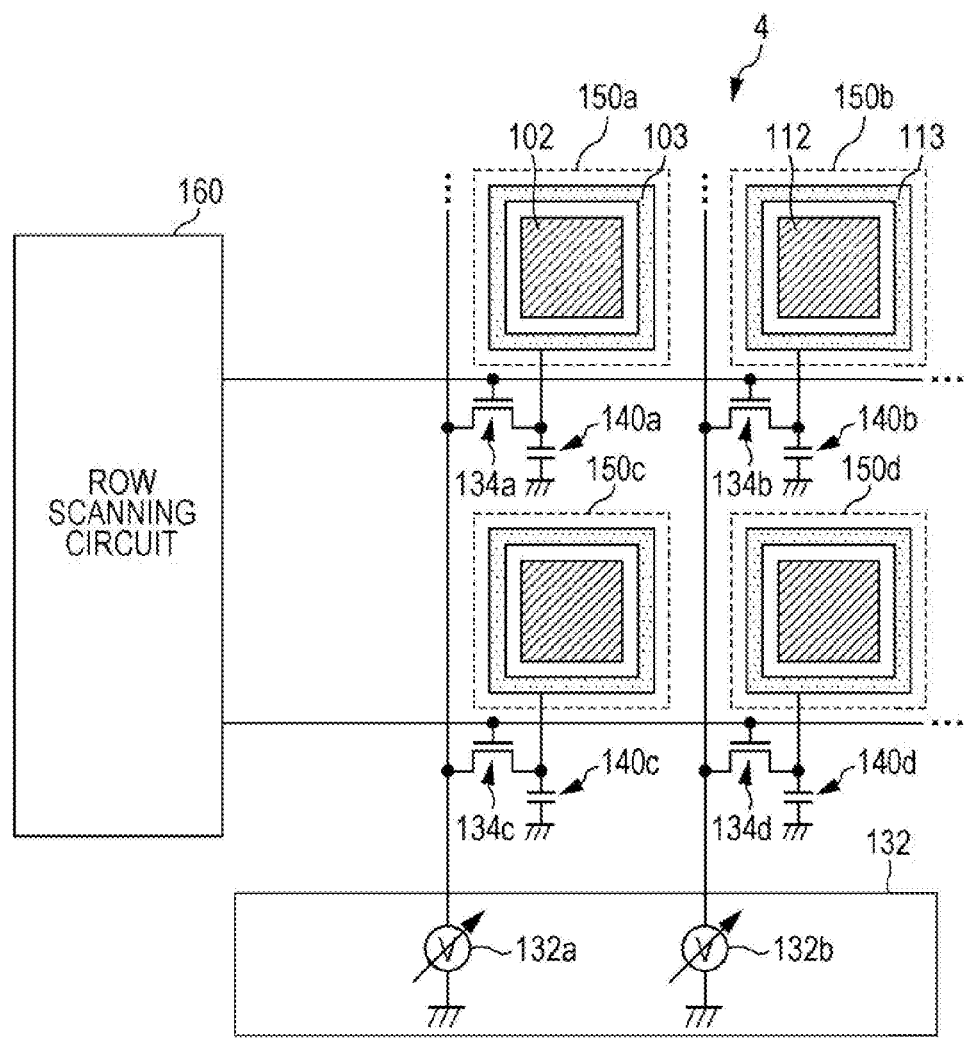
FIG. 7A schematically illustrates electrical connections among auxiliary electrodes, a row scanning circuit, and a voltage supply circuit in an imaging device in a fourth embodiment.

FIG. 7A schematically illustrates electrical connections among, in the imaging device 4 according to the fourth embodiment, the auxiliary electrodes 103 in the pixel cells 100 and 100a, the auxiliary electrodes 113 in the pixel cells 101 and 101a, the row scanning circuit 160, and the voltage supply circuit 132 including the voltage appliers 132a and 132b, each of which is provided for one column.

The voltage supply circuit 132 has the voltage appliers 132a and 132b, each of which is provided for one column and independently generates a predetermined voltage. The voltage supply circuit 132 can apply individual voltages to the pixel cells 150a to 150d through their respective transistors 134a to 134d. The transistors 134a to 134d are connected to the row scanning circuit 160 and the voltage applier 132a or 132b, whichever is appropriate. Predetermined voltages applied to control the transistors 134a to 134d, predetermined voltages applied to the pixel cells 100 and 100a, predetermined voltages applied to 101 and 101a are appropriately determined in response to, for example, commands entered by the manipulator manipulating the imaging device 4 or commands from the controller 202 (see FIG. 1) in the imaging device 4.

Figure 7B:
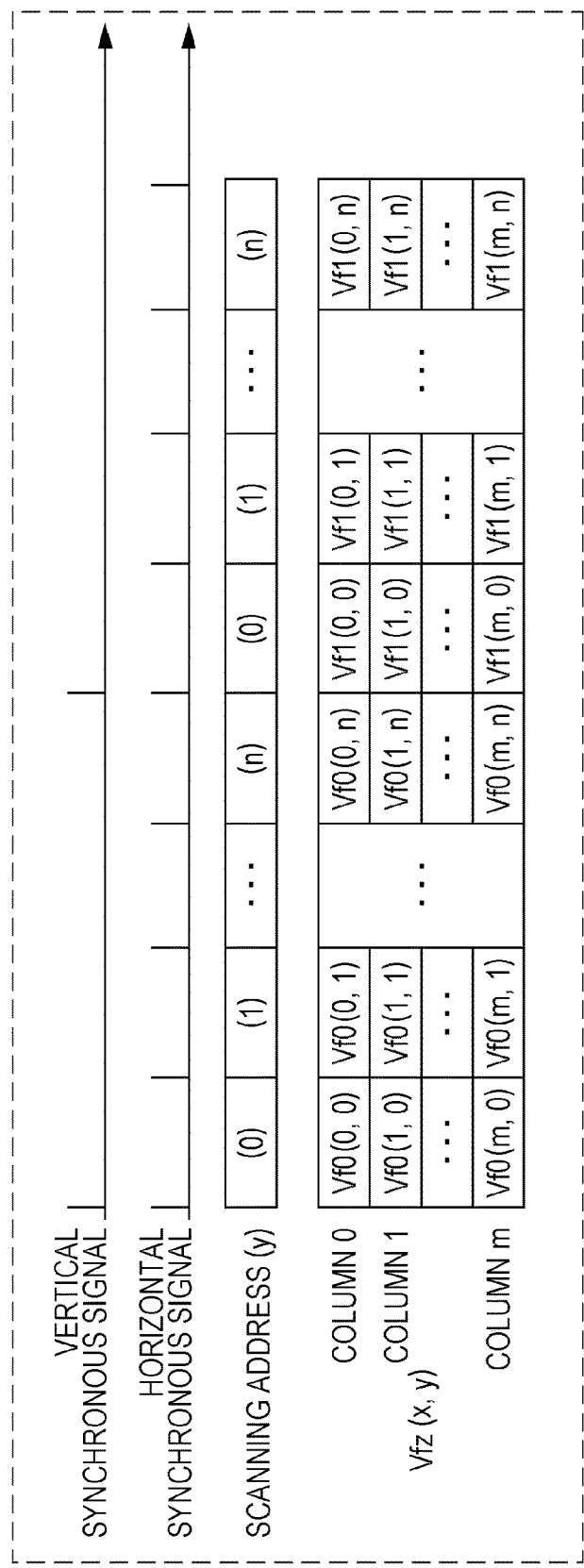
FIG. 7B is a timing diagram illustrating timing when the voltage supply circuit changes voltage for each area in the imaging device according to the fourth embodiment.

FIG. 7B is a timing diagram illustrating timing when the voltage supply circuit changes voltage for each area in the imaging device 4 according to the fourth embodiment. Items in this drawing are substantially the same as in FIG. 6B referenced in the third embodiment, except that, in this embodiment, "scanning address (x, y)" in the third embodiment is replaced with "scanning address (y). Vfz(x, y) indicates a voltage output from the voltage supply circuit 132 to the pixel cell positioned in the (x+1)th column and (y+1)th row in a z frame period. In the imaging device 4, pixel cells are placed in a matrix of (m+1) columns and (n+1) rows; x is an integer that is at least 0 and at most m, and y is an integer that is at least 0 and at most n.

In this embodiment, the active matrix method is used to apply voltages individually to the auxiliary electrodes 103 and 113 in all of the pixel cells 150a to 150d and to the capacitances 140a to 140d. Specifically, scanning address (0) is first selected by the row scanning circuit 160 at a timing at which a vertical synchronous signal and a horizontal synchronous signal are input, after which the voltage supply circuit 132 outputs voltages Vf0(0, 0) to Vf0(m, 0) corresponding to the relevant column addresses. Thus, voltages Vf0(0, 0) to Vf0(m, 0) are applied to scanning address (0), that is, the auxiliary electrodes 103 and 113 in the area in the first row, and to the capacitances 140a and 140b. Since voltages Vf0(0, 0) to Vf0(m, 0) are held in the capacitances 140a and 140b even if scanning address (0) is deselected, voltages Vf0(0, 0) to Vf0(m, 0) are maintained.

At a timing at which a next horizontal synchronous signal is input, the value of the y address is incremented. The voltage supply circuit 132 outputs a voltage corresponding to each column address. Thus, voltages Vf0(0, 1) to Vf0(m, 1) are applied to scanning address (1), that is, the auxiliary electrodes 103 and 113 in the pixel cells in the second row, and to the capacitances 140c and 140d. Since voltages Vf0(0, 1) to Vf0(m, 1) are held in the capacitances 140c and 140d even if scanning address (1) is deselected, voltages Vf0(0, 1) to Vf0(m, 1) are maintained. For all subsequent scanning addresses (y), voltages Vf0 are applied to the auxiliary electrodes 103 and 113 and the capacitances 140c and 140d in a similar manner and are held in the capacitances 140c and 140d. During one frame period, application of voltages to all pixel cells is completed in this way. This application of voltages to all pixels in one frame period is repeated for each frame.

In this embodiment, the voltage supply circuit 132 having the voltage appliers 132a and 132b, each of which is provided for one column, is used to control the size of the effective sensitivity area of each of a plurality of areas. Thus, it is possible to dynamically modulate sensitivity for each area at high speed. When the sensitivities of individual areas are optimized according to the photography scene, the dynamic range can be expanded.

As described above, in the imaging device 4 in this embodiment, the pixel cells 150a to 150d are two-dimensionally placed in the row direction and column direction. The voltage supply circuit 132 has the voltage appliers 132a and 132b, each of which is provided for one column. The voltage applier 132a applies a voltage to the capacitances 140a and 140c in the pixel cells 150a and 150c placed in the relevant column. Similarly, the voltage applier 132b applies a voltage to the capacitances 140b and 140d in the pixel cells 150b and 150d placed in the relevant column. The row scanning circuit 160 drives the transistors 134a to 134d, which are provided in correspondence to the pixel cells 150a to 150d, on a per-row basis.

Thus, individual voltages can be applied to the capacitances 140a to 140d, which are respectively provided in correspondence to the pixel cells 150a to 150d, in the active matrix method. Therefore, application of voltages to all of the pixel cells 150a to 150d is completed at high speed and with various sensitivity settings.

Fifth Embodiment

Next, an image module according to a fifth embodiment will be described with reference to FIG. 8.

Figure 8:
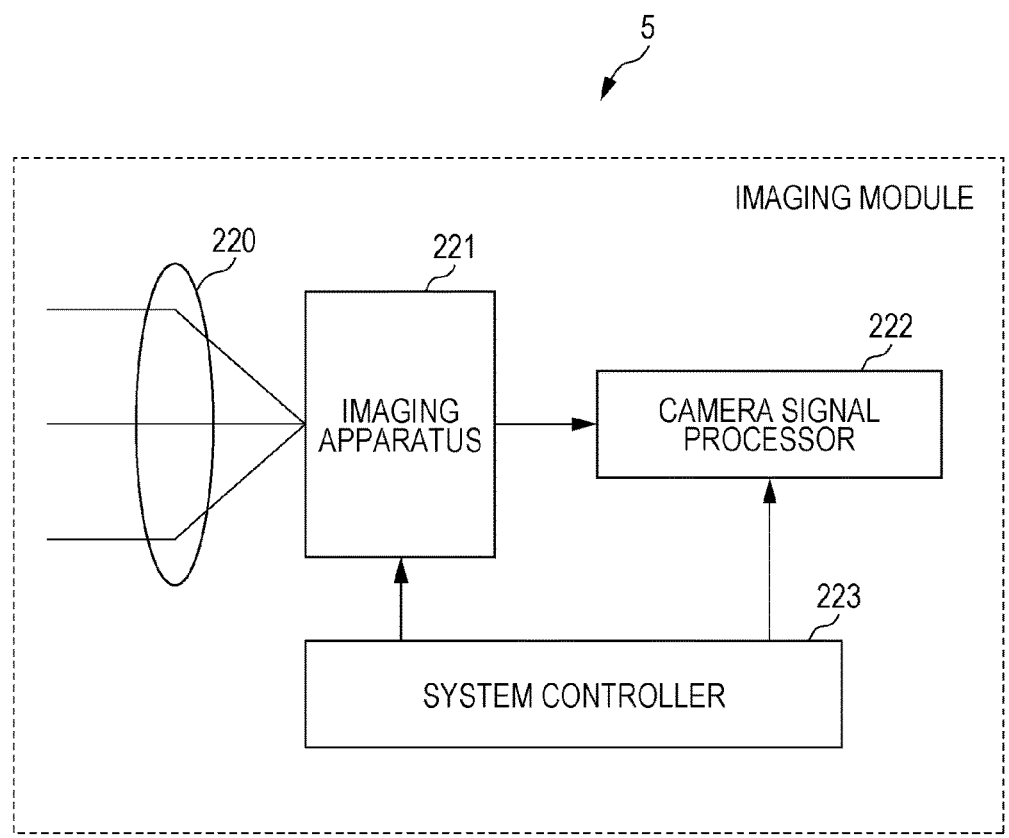
FIG. 8 is a schematic block diagram illustrating the structure of an imaging module according to a fifth embodiment.

FIG. 8 is a schematic block diagram illustrating the structure of the imaging module 5 according to the fifth embodiment. The imaging module 5 has an optical system 220 including a lens and a diaphragm, an imaging device 221, a camera signal processor 222, and a system controller 223. These constituent elements are typically mounted on a printed circuit board. The imaging module 5 is, for example, a digital still camera, a medical camera, a monitoring camera, a vehicle-mounted camera, a digital single-lens reflex camera, or a digital mirror-less single-lens camera.

As the imaging device 221, any one of the imaging device 1 in the first embodiment to the imaging device 4 in the fourth embodiment can be used.

The camera signal processor 222 is formed from a semiconductor element or the like. The camera signal processor 222 can be implemented by, for example, an image signal processor (ISP). The camera signal processor 222 processes an image signal output from the imaging device 221, and outputs the resulting image data.

The system controller 223 is implemented by, for example, a central processing unit (CPU) specific to a module. The system controller 223 controls the whole of the imaging module 5.

In this embodiment, an imaging module can be provided that suppresses saturation in low-sensitivity pixels and thereby enables wide dynamic range photography.

As described above, the imaging module 5 according to this embodiment has the imaging device 221 equivalent to the imaging device in any one of the above embodiments and also has the camera signal processor 222 that processes an image signal output from the imaging device 221 and creates image data.

Accordingly, an imaging module having the imaging device 221 that enables wide dynamic range photography is implemented.

So far, the imaging device and imaging module in the present disclosure has been described according to the first to fifth embodiments. However, the present disclosure is not limited to these first to fifth embodiments. The range of one or a plurality of aspects may include embodiments in which various variations that a person having ordinary skill in the art thinks of are applied to the embodiments described above and may also include other embodiments in which part of the constituent elements in the embodiments described above are combined, without departing from the intended scope of the present disclosure.

In the first and second embodiments, for example, the first area and second area, in each of which a capacitance is shared, have respectively corresponded to pixel cells in an even-numbered column and an odd-numbered column in the imaging area. However, this is not a limitation on the segmentation of the first area and second area. The first area and second area may correspond to pixel cells in both an even-numbered row and an odd-numbered row. Alternatively, one of two pixel cell groups placed in a checkered pattern may correspond to the first area, and the other may correspond to the second area.

The imaging device and imaging module in the present disclosure can be applied to, for example, sensor systems and various camera systems including a digital still camera, a medical camera, a monitoring camera, a vehicle-mounted camera, a digital single-lens reflex camera, and a digital mirror-less single-lens camera.

What is claimed is:

1. An imaging device comprising:
   at least one pixel cell that includes a first pixel cell, each of the at least one pixel cell including
      a photoelectric conversion layer having a first surface and a second surface opposite to the first surface,
      a pixel electrode on the first surface,
      an auxiliary electrode on the first surface, the auxiliary electrode surrounding the pixel electrode and being electrically insulated from the pixel electrode,
      a counter electrode on the second surface, the counter electrode facing both of the pixel electrode and the auxiliary electrode, and
      a charge detection circuit connected to the pixel electrode;
   a voltage supply circuit that supplies a voltage;
   a first switch that switches between electrical connection and electrical disconnection;
   a first capacitor that has one end connected to the auxiliary electrode of the first pixel cell and the other end held to a predetermined voltage; and
   a first control circuit connected to the first switch, the first control circuit causing the first switch to switch between electrical connection and electrical disconnection, wherein
   the voltage supply circuit is connected, through the first switch, to the auxiliary electrode of the first pixel cell and to the one end of the first capacitor.

2. The imaging device according to claim 1, wherein
   the at least one pixel cell includes a second pixel cell, and
   the auxiliary electrode of the second pixel cell is connected to the auxiliary electrode of the first pixel cell and to the one end of the first capacitor, and the voltage supply circuit is connected, through the first switch, to the auxiliary electrode of the second pixel cell.

3. The imaging device according to claim 1, further comprising:
a second capacitor;
a second switch that switches between electrical connection and electrical disconnection; and
a second control circuit connected to the second switch, the second control circuit causing the second switch to switch between electrical connection and electrical disconnection, wherein
the at least one pixel cell includes a second pixel cell,
the second capacitor has one end connected to the auxiliary electrode of the second pixel cell and the other end held to a predetermined voltage,
the voltage supply circuit applies a first voltage to the auxiliary electrode of the first pixel cell through the first switch, and
the voltage supply circuit applies a second voltage different from the first voltage, to the auxiliary electrode of the second pixel cell through the second switch.

4. The imaging device according to claim 1, wherein the voltage supply circuit includes the first switch.

5. The imaging device according to claim 3, wherein the voltage supply circuit includes the first switch and the second switch.

6. The imaging device according to claim 1, wherein
the first control circuit includes a first scanning circuit and a second scanning circuit, the first scanning circuit and the second scanning circuit being connected to the first switch, and
the first switch switches between electrical connection and electrical disconnection based on both of a signal from the first scanning circuit and a signal from the second scanning circuit.

7. The imaging device according to claim 1, wherein
the first control circuit includes a first scanning circuit connected to the first switch, and
the first switch switches between electrical connection and electrical disconnection based on a signal from the first scanning circuit.

8. An imaging module comprising
the imaging device according to claim 1, and
a camera signal processor that generates image data by processing an image signal output from the imaging device.

* * * * *